United States Patent [19]

Anantha et al.

[11] 4,139,910

[45] Feb. 13, 1979

[54] CHARGE COUPLED DEVICE MEMORY WITH METHOD OF DOUBLED STORAGE CAPACITY AND INDEPENDENT OF PROCESS PARAMETERS AND TEMPERATURE

[75] Inventors: Narasipur G. Anantha, Hopewell Junction; Fung Y. Chang; Barry J. Rubin, both of Wappingers Falls, all of N.Y.

[73] Assignee: International Business Machines Corporation, Armonk, N.Y.

[21] Appl. No.: 747,658

[22] Filed: Dec. 6, 1976

[51] Int. Cl.² .................... G11C 7/04; G11C 11/34; G11C 19/28
[52] U.S. Cl. .................................. 365/183; 365/212
[58] Field of Search ................ 340/173 R, 173 RC; 357/24; 307/238, 221 D; 364/900 MS File, 200 MS File; 365/45, 73, 183, 221, 211, 212, 168

[56] References Cited

U.S. PATENT DOCUMENTS

| 3,772,658 | 11/1973 | Sarlo | 365/78 |
|---|---|---|---|
| 3,789,247 | 1/1974 | Beausoleil et al. | 365/183 |
| 3,891,977 | 6/1975 | Amelio et al. | 340/173 R |
| 3,930,255 | 12/1975 | Means | 357/24 X |
| 3,958,210 | 5/1976 | Levine | 340/173 R |

OTHER PUBLICATIONS

David F. Hoeschele, Jr., *Analog to Digital/Digital to Analog Conversion Techniques,* pub. Aug. 14/68, pp. 9-10, 358-360, John Wiley & Sons, Inc.

*Primary Examiner*—Bernard Konick
*Assistant Examiner*—Donald McElheny
*Attorney, Agent, or Firm*—James M. Thomson

[57] ABSTRACT

A two phase charge coupled device memory array wherein the storage capacity is increased by using multiple levels of charge storage within a given cell. A voltage waveform generator capable of producing one of four different voltages is utilized to input and output charge in the multiple level charge method. In determining the level of charge stored within a given cell in the array, the voltage difference between a reference cell and an adjacent addressing cell is used. By determining the voltage level of the addressing cell at which charge overflows the reference cell and counting the number of times it overflows as the voltage generator is successively stepped through its four voltage levels, the level of the original charge input to a given cell can be determined. To make the multiple level scheme independent of process parameters and temperature, the same two cells are utilized for both input and output functions. Various other cells are provided to block and route charge with respect to the array. The method could be utilized with three phase and four phase systems, if desired.

9 Claims, 5 Drawing Figures

CHARGE COUPLED DEVICE MEMORY WITH METHOD OF DOUBLED STORAGE CAPACITY AND INDEPENDENT OF PROCESS PARAMETERS AND TEMPERATURE

BACKGROUND OF THE INVENTION

The present invention relates to charge coupled device memories. More particularly, the invention concerns a two phased charge coupled device memory array wherein the storage capacity is doubled by inputting, circulating and outputting multiple levels of charge.

DESCRIPTION OF THE PRIOR ART

Charge coupled devices are well known in the prior art. For example, a typical semiconductor charge coupled device shift register is described in Boyle et al., Bell System Technical Journal, 49, 587, 1970. In addition, U.S. Pat. Nos. 3,853,634 and 3,891,997 described CCD memories.

Basically, charge coupled devices are metal oxide semiconductor devices that store and transfer information in the form of electrical charge. The charge coupled device can be distinguished by a property that the semiconductor portion of the device is substantially homogeneously doped, with regions of different conductivity being required only for injecting or extracting charges. Basically, the CCD comprises a structure wherein a plurality of metal electrodes are disposed in a row over an insulator which, in turn, overlies and is contiguous with the surface of a semiconductor body. Sequential application of voltages to the metal electrodes induces potential wells in the surface of the semitconductor body in which packets of excess minority carriers or charge can be stored and between which these packets of charge can be transferred.

To permit satisfactory operation of any charge coupled device, controlled transfer of charge in one direction is required. An article entitled "charge coupled semiconductor devices" BSTJ April 1970, pages 587–593, discusses a three phase system to provide asymmetry of charge transfer with uniform dielectric thickness under the gate electrodes on a homogeneous semiconductor body.

In addition, two phase CCD's have been designed wherein non-uniform dielectric thicknesses under the gate are utilized so that appropriately asymmetrical potential wells are formed whenever a voltage is applied to a gate electrodes.

With respect to either two phase or three phase systems, various shift register, image scanning arrays, and other device configurations have been utilized in specific applications. However, with respect to CCD memories the prior art is, at present, limited to configurations wherein two levels of charge are utilized, i.e., either a presence of charge or an absence of charge. It should be recognized that the capacity of CCD memories could be increased if a method enabling the use of multiple levels of charge storage in CCD's were developed.

SUMMARY OF THE INVENTION

Accordingly, it is an object of the invention to provide a charge coupled device memory wherein the storage capacity is doubled by utilizing multiple levels of charge.

This object and other features and advantages of the invention are attained in a CCD memory shift register wherein the storage capacity is doubled by inputting, circulating and storing multiple levels of charge. A voltage waveform generator is provided that is capable of producing four different levels of input voltage to the shift register. In inputting charge, one of the levels is selected according to an input code, and applied to the gate of an addressing cell. The level of voltage applied to the gate determines the depth of the potential well formed in that cell. An adjacent cell is used as a reference in storing a predetermined level of charge within the addressing cell. The charge is then circulated in the memory from input to output in the usual fashion.

To determine or measure the level of the charge once it has been circulated, the voltage difference between the two adjacent cells is again used. By decrementing the voltage from the waveform generator through its four levels and applying the voltages sequentially to the addressing cell the charge contained within the cell is eventually caused to overflow the adjacent reference cell. By identifying when the charge overflows and counting the number of times it overflows, the magnitude of the original charge can be determined. This method of using multiple levels of charge in the memory is independent of process parameters and temperature, since the same two cells are used for input and output functions. Various other transfer cells are used to block and route the charge. The scheme described is particularly adapted for use in a two phase charge coupled device. However, if desired, the scheme could be used with three and four phase systems, and with memories utilizing other than shift register configurations.

BRIEF DESCRIPTION OF THE DRAWINGS

Other features and advantages of the invention will be apparent from the following detailed description taken in conjunction with the accompanying drawings wherein.

DESCRIPTION OF THE PREFERRED EMBODIMENT

Figure 1:
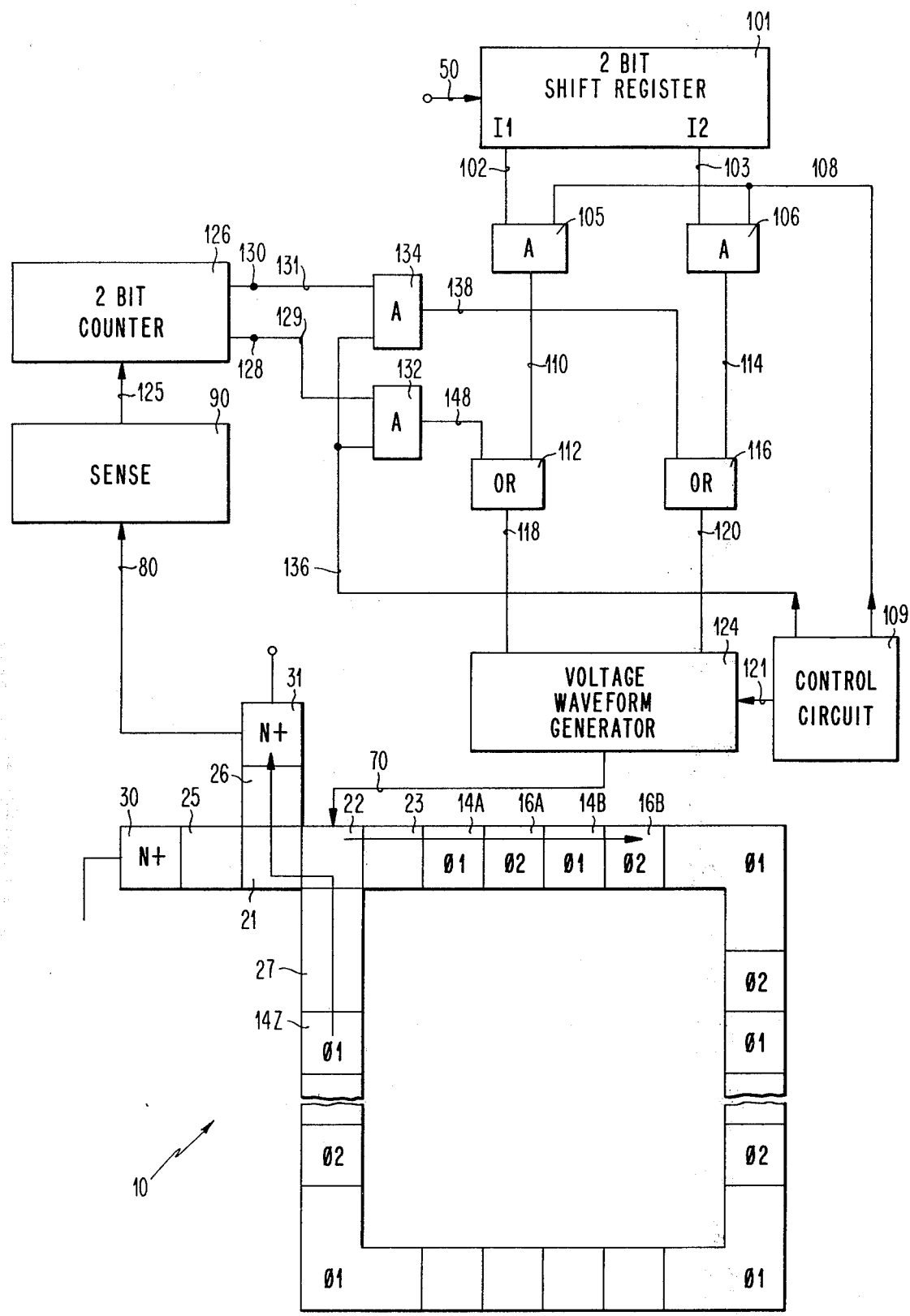
FIG. 1 is an electrical schematic diagram of one preferred embodiment of the invention.
Figure 4:
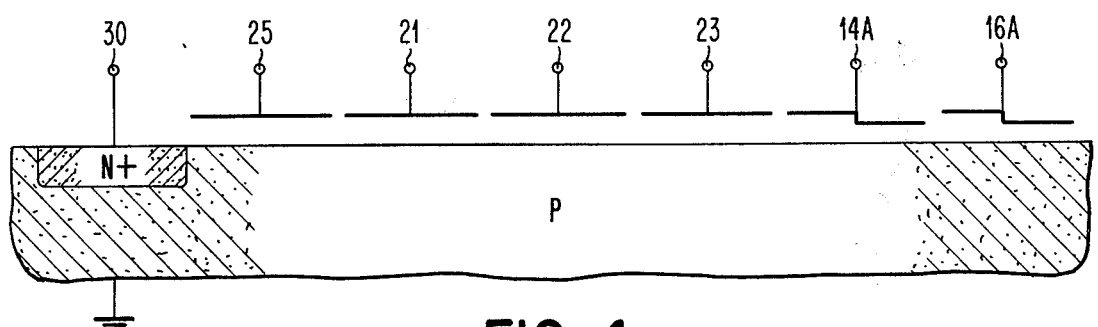
FIG. 4 is a schematic diagram of a portion of a substrate illustrating cells of the device of FIG. 1.

Referring now to the drawings and particularly to FIGS. 1 and 4, a preferred embodiment of the invention will be described. FIG. 1 comprises a schematic illustration of a charge coupled device memory 10 of the shift register or bucket brigade type. Memory 10 is illustrated as a two phase device including phase one cells designated by the numeral 14 and adjacent phase two cells designated by numerals 16. As is best seen in FIG. 4, each of these cells has a gate and gate electrode associated therewith. In conventional fashion, the gate overlies a region of insulating material which is deposited upon a P type semiconductor substrate. The memory device further includes cells 30, 31 which comprise N regions formed within the substrate, each having an electrode and an input terminal associated therewith.

Cells 30, 31 comprise source or sink regions for minority carriers or charge, again in well known fashion. It should be recognized that an N type substrate could be utilized with P type source regions, if desired.

In the preferred embodiment each cell of the two phase device attains its asymmetrical characteristics by virtue of a dual level insulating region under the gate, again as best seen in FIG. 4. This is a conventional design for two phase cells. If desired, however, asymmetrical characteristics for the two phase device could be attained in other well known fashion. Likewise, if desired, three or four phase cells and cell configurations of other types could be utilized with the invention.

In addition cells 21, 22 and 23 are provided in the memory to input and output the charge. As best seen in FIG. 4, each of these cells includes a gate and gate electrode overlying a single thickness oxide region deposited upon the semiconductor surface. In addition, the memory includes transfer gates 25, 26 and 27. Again, the transfer gates each include a gate and gate electrode overlying a single thickness of oxide deposited upon the semiconductor surface.

The memory is adapted to receive digital data input signals, provided on conductor 50, to an addressing circuit illustrated in FIG. 1. The addressing circuit provides voltage input signals to the memory on conductor 70 which result in the storage of charge therein. The charge is subsequently circulated around the bucket brigade memory configuration in the direction indicated by the arrows, and retrieved by a conventional charge sensing means 90 which receives an output from the memory via conductor 80. A two bit counter 126 and associated circuitry is provided to permit selective recirculation of the data received by sensing means 90.

In the preferred embodiment the memory and addressing circuit is adapted to input, circulate, and store four different levels of charge throughout the device. Accordingly, the serial digital data input stream is divided into bit pairs, with the states of the bit pairs being utilized to define a bit code which determines which level of voltage is used to store charge in a given cell on each data input sequence. The input code is illustrated in Table 1 below.

Table 1

| Bit 1 | Bit 2 | Defined As | Voltage Level |
| --- | --- | --- | --- |
| 0 | 0 | 0 | V1-10V. |
| 0 | 1 | 1 | V2-12V. |
| 1 | 0 | 2 | V3-14V. |
| 1 | 1 | 3 | V4-16V. |

Thus, it should be apparent that a bit pair representing 00 results in the input of voltage level V1 whereas a bit pair representing the combination 10 results in inputting of voltage level V3.

To facilitate use of the code described above, a conventional two bit shift register 101 is provided in the addressing circuit adapted to receive data from conductor 50 and convert it into bit pairs on output conductors 102, 103. Conductors 102, 103 serve as inputs to AND gates 105, 106 respectively. An enable signal is provided on conductor 108 to AND gate 105, 106 from a control circuit 109. A conductor 110 connects the output of AND gate 105 to an input of OR gate 112. In similar fashion, a conductor 114 connects the output of AND gate 106 to an input OR gate 116. Conductors 118, 120 connect the outputs of OR gates 112, 116 respectively to a voltage waveform generator 124. Voltage generator 124 is of conventional design and produces one of four possible voltage levels at its output on conductor 70 in response to the coded inputs received on conductors 118, 120 respectively. Thus, the voltage waveform generator produces the voltage level outputs represented in Table 1 in response to the bit input signals represented therein. The voltage waveform generator also receives a control signal from control circuit 109 via a conductor 121. This control signal causes the voltage generator to sequentially produce the voltage levels V4, V3, V2 and V1 during charge outputting operation.

In order to facilitate selective recirculation of data in the memory a conventional recirculating bit counter 126 is provided, adapted to receive input signals from sense circuit 90 via conductor 125. The counter is a two bit counter and thus provides dual outputs 128, 130 which comprise the memory output. Conductors 129, 131 are connected to the 128, 130 outputs and serve as inputs to AND gates 132, 134 respectively. Conductor 136 provides an enable signal input to each of AND gates 132, 134 from the control circuit. As shown, a conductor 148 connects the output of AND gate 132 to an input of OR gate 112; and a conductor 138 connects the output of the AND gate 134 to an input of OR gate 116. Accordingly, data sensed by circuit 90 is provided to counter 126 where it is formatted into bit pairs in the same fashion as the data formatted in register 101. The bit pairs can then be provided selectively to the voltage waveform generator for recirculation into the memory. Thus, an enable signal from control circuit 109 to AND gates 132, 134 is provided if recirculated data is to be provided to the memory, and an exclusive enable signal from control circuit 109 to AND gates 105, 106 is provided if new data is to be stored in the memory. In usual operation, recirculated data will be interleaved with new data.

In addition to the circuitry described hereinabove, the control circuit 109 is adapted to provide selectively a reset signal to cell 31 and a control signal to cell 30. In addition, control signals are provided to the electrodes of blocking cells 25, 26, 27 in a fashion described hereinafter and control signals are provided to sense circuit 90 and counter 126. Moreover, it should be recognized that additional voltage signals are provided, selectively, to the electrodes of cells 21, 23 and to the electrodes of the storage cells of both phases of the memory register in order to circulate data in the register in more or less conventional fashion. The timing involved in the application of these signals is explained hereinafter.

Figure 2:
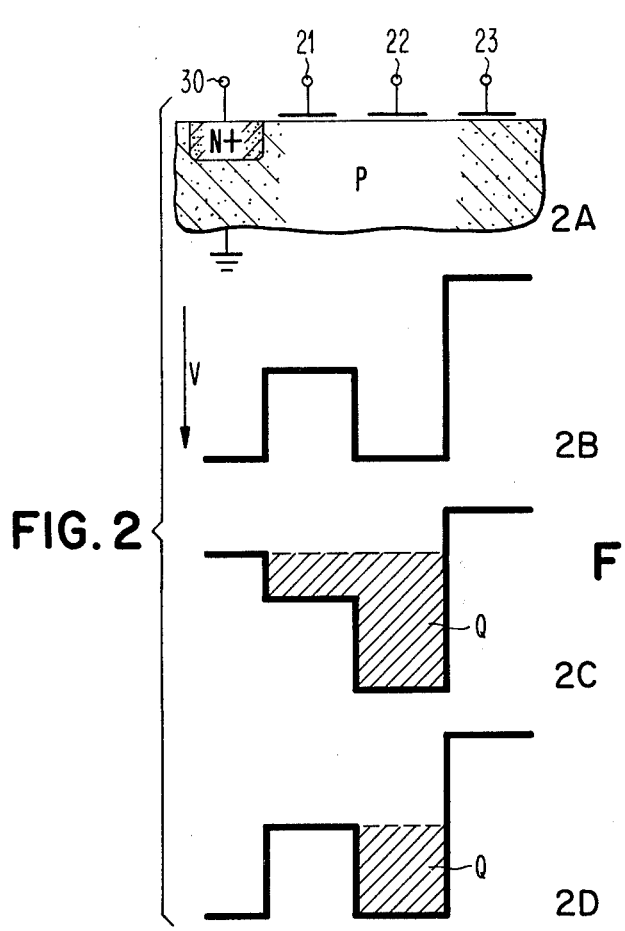
FIG. 2 is a waveform diagram showing voltage levels associated with three cells of a CCD device substrate during a typical charge input operation.

Referring now to FIG. 2, the way in which multiple charge levels can be inputted to the memory using a cell configuration such as that illustrated in the FIG. 1 will be explained. It should be recognized that in charge coupled devices the amount of charge stored in a potential well is determined by voltage applied to the well. Thus, one of four voltage levels is applied to the gate of addressing cell 22 and a reference potential is applied to the gate of reference cell 21. Consequently, a potential well is created in cell 22 that is one of four magnitudes with respect to the reference value established by cell 21. In FIG. 2B, the cell voltage relationships for inputting charge are illustrated. A low voltage is supplied to cell 23 whereby it acts to block charge from flowing into the memory. A constant or reference voltage is applied to cell 21 and one of the selected voltages from waveform generator 124 is applied to cell 22 thereby establishing a potential well of predetermined magnitude between cells 21 and 23.

Once the cell magnitude is established, a voltage is provided to the N+ source region under cell 30 as illustrated in FIG. 2C. The voltage on the N+ region causes charge to build up and be transferred past cell 21 into the potential well created in cell 22. It should be recognized that the voltage on cell 30 is lowered below the reference value established on cell 21 so that the potential well in cell 22 is filled completely with charge. After a suitable charging interval, the voltage on cell 30 is altered to the level illustrated in FIG. 2D so that any excess charge in cell 22 will migrate or flow back to cell 30. This creates an increment of charge in cell 22 which is directly proportional to the increment of voltage selected by generator 124. After the desired increment of charge is stored in gate 22, it is transferred across cell 23 to the first cell of the shift register and is subsequently circulated through the memory device in conventional fashion. It should be apparent, then, that the inputting method permits easy storage of multiple levels of charge in a charge coupled device potential well.

Figure 3:
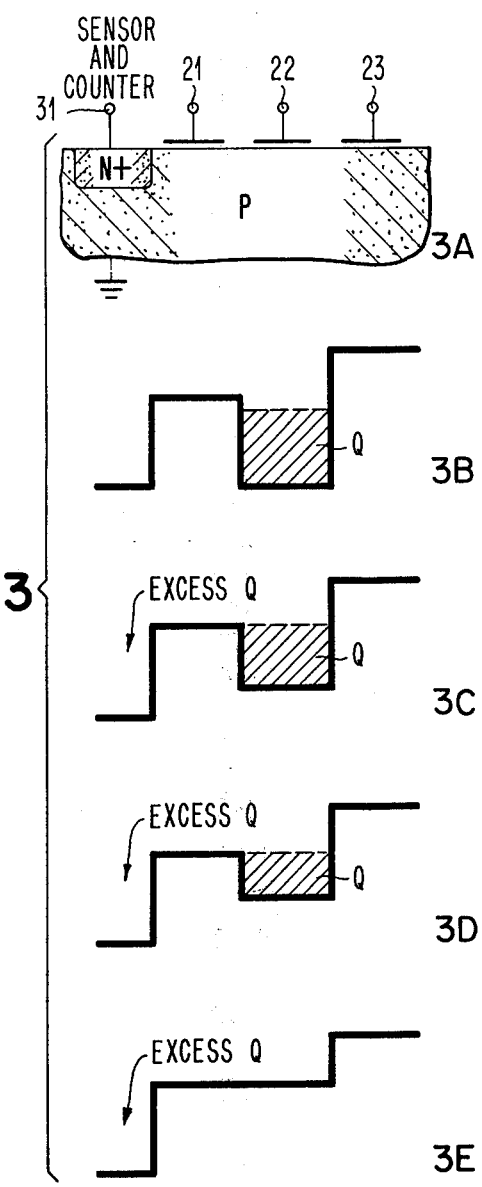
FIG. 3 is a waveform diagram showing voltage levels associated with the same three cells of a CCD device substrate during a typical charge output operation.

Referring to FIG. 3, the method by which the charge is removed from the memory and sensed will be explained. FIG. 3A illustrates cells 21, 22 and 23 along with the N region associated with cell 31. To determine the level or increment of charge within a potential well within the memory, the charge is transferred to cell 22. The voltage on cell 23 is then set to a low value so that cell 23 acts to block charge transfer to the input side of the memory. The voltage on cell 21 is set to the reference value and the voltage on cell 22 is set to the highest of the four values provided by voltage waveform generator 124. With the voltage on the N+ region in cell 31 set to a high level any excess charge from cell 22 overflowing cell 21 will migrate to the N+ region for detection by sensing circuit 90. The voltage relationships described above are represented by the waveforms of FIG. 3B.

The voltage on cell 22 is then decreased in steps through the four levels of voltage of generator 124. If the decrease from the fourth level to the third level results in excess charge being transferred to the N+ region and the sensor then the 11 data condition is represented. In the absence of charge nothing is detected. By the same token a decrease from the third level to the second level may result in charge detection of the 10 condition. Finally, if charge is detected upon decrease from the second level to the first level, the 01 condition exists. If no charge is detected, a 00 condition exists. Thus, successive monitoring of the charge conditions permits identification of the bit condition stored in the cell.

Since cells 21, 22 and 23 are utilized for both inputting and outputting of data a method for inputting a given level of charge, circulating the charge in memory and then detecting it exists. This assumes that the memory is not of sufficient length so that the charge loss entailed in transfer through the memory reaches a substantial portion of the increments of charge.

Figure 5:
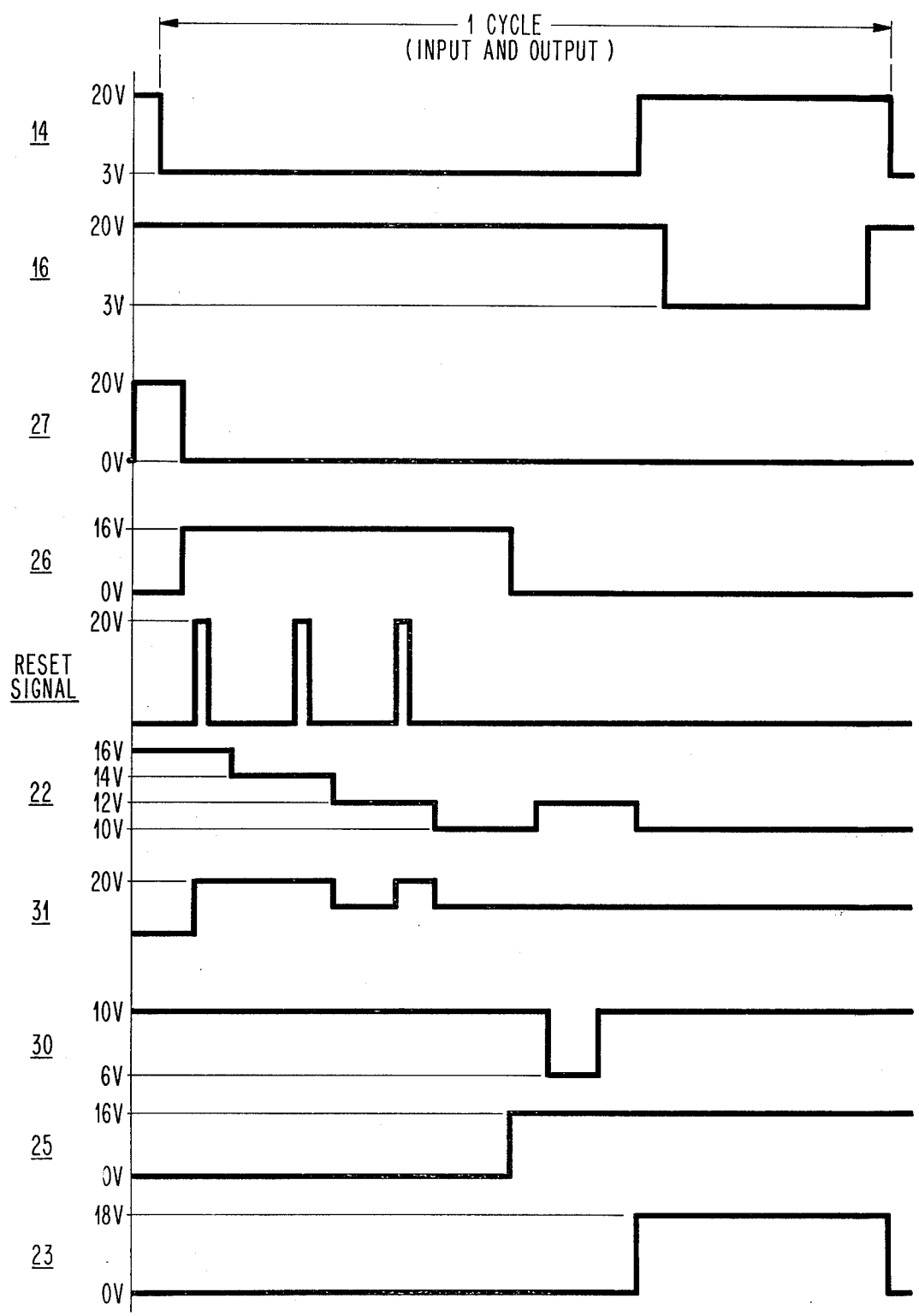
FIG. 5 is a waveform diagram illustrating voltage states existing in the embodiment of FIG. 1 during charge input, transfer and output operations.

Referring now to FIGS. 1 and 4 a complete cycle of operation of the preferred embodiment through circulate, output and input cycles is described. The waveforms illustrated in FIG. 5 represent the voltage states of the various cells for such operation.

The first step in preparation for outputting charge entails movement of the charge stored in cell 14Z to cell 22 via cell 27. At the same time, the charge stored in cell 14A is transferred to 16A and the charge in 14B is transferred to 16B, etc. With a 20 volt signal on the phase one cells, a 20 volt signal is applied to cell 27. At the same time, a 16 volt signal is present at cell 22. The voltage on the phase one cells is then reduced to a low value whereby the charge stored within cell 14Z migrates to cell 27. At a short interval thereafter, the voltage on cell 27 is returned to a low value whereby the charge which has migrated from 14Z to cell 27 is further transferred to cell 22 where it can be detected. It should be recognized that cell 23 is held in a blocking state during this operation.

Since cell 22 is at its highest voltage level, i.e., 16 volts, a potential well exists which will store all of the charge from cell 14Z. A 20 volt signal is applied to the phase two electrodes of the circuit, i.e., 16A, 16B, etc. The 20 volt signal causes the charge in 14A to be transferred to 16A and the charge in 14B to be transferred to 16B, etc. This results in incrementing each charge stored in the cell through one cell position along the circulating path. It should be apparent that due to the use of two oxide thicknesses under each gate the gates are asymmetrical. Consequently, charge from 14B will not overflow into 16A.

Once the charge transfer is accomplished the output cycle is initiated by applying a 16 volt signal to cell 26 thereby rendering the latter conducting and applying a low voltage signal to cells 25, 27 thereby blocking them. With cell 22 at the 16 volt level, a 20 volt reset signal is applied to cell 31. This increases the voltage of cell 31 thereby permitting any excess charge from cell 22 to flow through the reference cell and cell 26 to cell 31. The voltage on cell 22 is then reduced to 14 volts. This permits charge overflow if the charge within cell 22 is of sufficient magnitude. However, as represented in FIG. 4 no increment of charge is sensed at the 14 volt level. Then a 20 volt reset pulse is again applied to cell 31. Subsequently, the voltage level on cell 22 is reduced to 12 volts. This results in flow of an increment of charge into cell 31 which is detected by sense circuit 90 and counted. Then the 20 volt reset pulse is again applied to gate 31. In the final decrement from 12 volts to 10 volts another charge increment is detected and counted by counter 126. Consequently, the level of charge stored within cell 14Z, after transfer to cell 22 is representative of a 10 data condition.

With the output cycle completed, cells 26, 27 are set to blocking states and cell 25 is set to a conducting state. An enabling signal via conductor 136 to AND gates 132, 134 then selects the output of counter 126 for recirculation or an enabling signal via conductor 108 to AND gates 105, 106 selects the output of register 101 for input of new information. The selected output is applied to voltage waveform generator 124 whereby a predetermined voltage level is produced by generator 124 that represents the bit pair input. The voltage is applied to cell 22, cell 23 remains in a blocking state, and cell 21 is maintained at the reference voltage level. Consequently, the application of a low voltage signal to cell 30 results in transfer of charge from the N+ region associated therewith to cell 22, with the increment of charge stored being proportional to the voltage level produced by generator 124. Thus, in FIG. 5 it should be apparent that a 12 volt level was selected representing a 01 input.

After charge is inputted to cell 22 the charge is transferred from cell 22 to cell 14A and the charge in each of cells 16 of the memory is transferred to the adjacent phase one cells. This is accomplished by unblocking cell 23, applying a 20 volt signal to all the phase one cells and subsequently lowering the voltage to all the phase two cells. The memory is then in a state where charge contained within cell 14Z can again be transferred to cell 22 for readout and another cycle can be initiated.

It should be apparent that the particular circuitry illustrated is intended for use of the memory described herein with a four level voltage signal and a two phase system. However, other bit input coding systems and levels of voltage could be utilized, as well. A significant aspect of the invention is the use of a simple reliable method to store multiple levels of charge within a charge coupled device memory. The method results in doubling of the memory capacity by storing four levels of charge instead of two in a given cell. In addition, the four level method is independent of process variations since it uses the same set of gates to input and output the charge.

While the invention has been particularly shown and described with reference to the preferred embodiment thereof, it will be understood by those skilled in the art that various changes in form and details may be made therein without departing from the spirit and scope of the invention.

We claim:

1. A charge coupled device memory adapted for storage of at least three levels of charge increments including
    an array of charge coupled device cells arranged on a substrate for storage and circulation of charge increments therethrough having at least one charge reception cell and at least one charge output cell,
    an addressing cell on said substrate and a reference cell arranged adjacent thereto,
    voltage generating means for applying a selected one of at least three levels of voltage to said addressing cell to create a potential storage well of preselected magnitude in said cell,
    charge source means for selectively providing charge to said addressing cell for storage therein with said reference cell establishing one of said at least three levels as the level of charge stored, and
    storage control means for selectively inputting charge stored within said addressing cell to said reception cell, circulating said charge through said array of cells, and outputting charge from said array to said addressing cell.

2. The charge coupled device of claim 1 further including sensing means for sensing the magnitude of said charge as the voltage means applies said multiple levels of voltage to the addressing cell.

3. The charge coupled device of claim 2 wherein said reference cell is separated from the charge reception cell by a first charge blocking means and is separated from the charge output cell by a second charge blocking means.

4. The charge coupled device of claim 3 wherein said voltage means comprises a voltage generator capable of generating four voltage levels, selectively for application to said addressing cell, and wherein said reference cell is provided with a reference voltage.

5. The charge coupled device of claim 4 further including first register means adapted to provide coded inputs to said voltage generator representing new data and counter means adapted to provide coded inputs to said voltage generator representing data to be recirculated in said memory.

6. A method of inputting at least three levels of charge increments to an addressing cell of a charge coupled device memory including the steps of
    (a) selecting a potential value which represents a predetermined coded input representing one of said levels of charge to said memory,
    (b) applying a voltage to said addressing cell which represents said selected value to create a potential well therein having a predetermined value with respect to the potential of a reference cell contiguous to said addressing cell,
    (c) inputting charge increments to said addressing cell from a source until said addressing cell is charged to a level in excess of said reference value,
    (d) permitting said excess charge to leak off in increments until the addressing cell is charged to the level of said reference cell, and
    (e) transferring charge from the addressing cell to an input cell of the memory array.

7. A method of detecting information stored within a charge coupled device memory array adapted for storage of at least three levels of charge increments comprising the steps of
    (a) transferring an incremental charge from an output cell of said memory array to an addressing cell which has a potential well capable of storing the largest possible charge value stored in the memory,
    (b) applying multiple levels of voltage corresponding to said levels of charge sequentially to said addressing cell to reduce the potential well of the addressing cell with respect to a reference cell located adjacent thereto, and
    (c) detecting the overflow of charge from said addressing cell past said reference cell as an indication of the level of charge stored therein.

8. A four level charge coupled memory system comprising:
    two adjacent cells means for inputting and outputting charge information into said system;
    means for inputting one of four voltage levels to one of said two cells at one time;
    means for determining the level of charge in said cell means by the voltage difference between the said cell means; and
    said means for determining including means for sequentially applying four different voltage levels from a high to low value to one of said cell means and means for identifying when charge overflows whereby the original charge present is determined.

9. Apparatus for storing a plurality of binary bits at a preselected storage site including a plurality of serially connected storage sites each adapted to retain one of a plurality of at least three distinct charge increment levels,
    means for establishing a selected one of said plurality of charge increment levels in a desired one of said storage sites, and
    means for detecting which of the charge increment levels was established in said storage site.

* * * * *